(12) United States Patent
Lin et al.

(10) Patent No.: US 12,406,973 B2
(45) Date of Patent: Sep. 2, 2025

(54) STRUCTURE WITH PHOTODIODE, HIGH ELECTRON MOBILITY TRANSISTOR, SURFACE ACOUSTIC WAVE DEVICE AND FABRICATING METHOD OF THE SAME

(71) Applicant: UNITED MICROELECTRONICS CORP., Hsin-Chu (TW)

(72) Inventors: Da-Jun Lin, Kaohsiung (TW); Chih-Wei Chang, Tainan (TW); Fu-Yu Tsai, Tainan (TW); Bin-Siang Tsai, Changhua County (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 454 days.

(21) Appl. No.: 18/077,192

(22) Filed: Dec. 7, 2022

(65) Prior Publication Data

US 2024/0162208 A1 May 16, 2024

(30) Foreign Application Priority Data

Nov. 10, 2022 (CN) .......................... 202211404042.2

(51) Int. Cl.
*H10D 30/01* (2025.01)
*H01L 25/16* (2023.01)
(Continued)

(52) U.S. Cl.
CPC ............. *H01L 25/167* (2013.01); *H03H 3/08* (2013.01); *H03H 9/02976* (2013.01);
(Continued)

(58) Field of Classification Search
CPC .... H10F 39/8037; H10F 39/199; H10F 30/21; H10F 30/221; H10F 30/2218; H10F 30/26; H10F 39/802; H10F 39/8057; H10F 39/8067; H10F 77/40; H10F 30/288; H10F 30/289; H10F 77/12–1285; H10F 71/00–1395; H10F 77/933; H10F 77/957–959; H10F 77/50; H10F 77/496;
(Continued)

(56) References Cited

U.S. PATENT DOCUMENTS 7,112,860 B2   9/2006   Saxler
7,294,540 B2   11/2007  Lee
(Continued)

*Primary Examiner* — Moin M Rahman
(74) *Attorney, Agent, or Firm* — Winston Hsu

(57) ABSTRACT

A structure with a photodiode, an HEMT and an SAW device includes a photodiode and an HEMT. The photodiode includes a first electrode and a second electrode. The first electrode contacts a P-type III-V semiconductor layer. The second electrode contacts an N-type III-V semiconductor layer. The HEMT includes a P-type gate disposed on an active layer. A gate electrode is disposed on the P-type gate. Two source/drain electrodes are respectively disposed at two sides of the P-type gate. Schottky contact is between the first electrode and the P-type III-V semiconductor layer, and between the gate electrode and the P-type gate. Ohmic contact is between the second electrode and the first N-type III-V semiconductor layer, and between one of the two source/drain electrodes and the active layer and between the other one of two source/drain electrodes and the active layer.

11 Claims, 6 Drawing Sheets

(51) Int. Cl.
- *H03H 3/08* (2006.01)
- *H03H 9/02* (2006.01)
- *H10D 30/47* (2025.01)
- *H10D 30/67* (2025.01)
- *H10D 62/85* (2025.01)
- *H10D 64/01* (2025.01)
- *H10D 64/23* (2025.01)
- *H10D 64/64* (2025.01)
- *H10F 71/00* (2025.01)
- *H10F 77/124* (2025.01)
- *H10F 77/14* (2025.01)
- *H10F 77/20* (2025.01)

(52) U.S. Cl.
CPC ......... *H10D 30/015* (2025.01); *H10D 30/475* (2025.01); *H10D 30/6737* (2025.01); *H10D 30/6738* (2025.01); *H10D 30/675* (2025.01); *H10D 62/85* (2025.01); *H10D 62/8503* (2025.01); *H10D 64/01* (2025.01); *H10D 64/258* (2025.01); *H10D 64/64* (2025.01); *H10F 71/1278* (2025.01); *H10F 77/1246* (2025.01); *H10F 77/146* (2025.01); *H10F 77/206* (2025.01)

(58) Field of Classification Search
CPC .... H10F 77/413; H10F 77/407; H10F 77/703; H10F 77/707; H10F 39/18–1898; H10F 39/182–1825; H10F 39/184–1847; H10F 39/186–1865; H10F 39/189–1898; H10F 71/1278; H10F 77/1246; H10F 77/146; H10F 77/206; H10F 30/223; H10F 39/103; G01S 7/4863; G01S 17/10; G01S 17/894; H10K 30/88; H10K 30/87; H10N 30/00; H10N 39/00; H10N 30/30–308; H10N 30/40; H10N 30/20–208; H10D 8/60; H10D 8/051; H10D 8/50; H10D 62/8325; H10D 62/8503; H10D 64/01; H10D 64/64; H10D 62/126; H10D 62/60; H10D 62/106; H10D 62/102; H10D 62/124; H10D 30/015; H10D 30/475; H10D 30/6737; H10D 30/6738; H10D 30/675; H10D 62/85; H10D 64/258; H10D 62/149; H10D 62/343; H10D 64/256; H10D 84/811; H10D 84/01; H10D 84/05; H10D 84/40; H01L 25/167; H03H 3/08; H03H 9/02976; H03H 2001/0064

See application file for complete search history.

(56) References Cited

U.S. PATENT DOCUMENTS

| | | |
|---|---|---|
| 8,304,271 B2 | 11/2012 | Huang |
| 2008/0169474 A1* | 7/2008 | Sheppard ............... H10N 39/00 257/E27.014 |

* cited by examiner

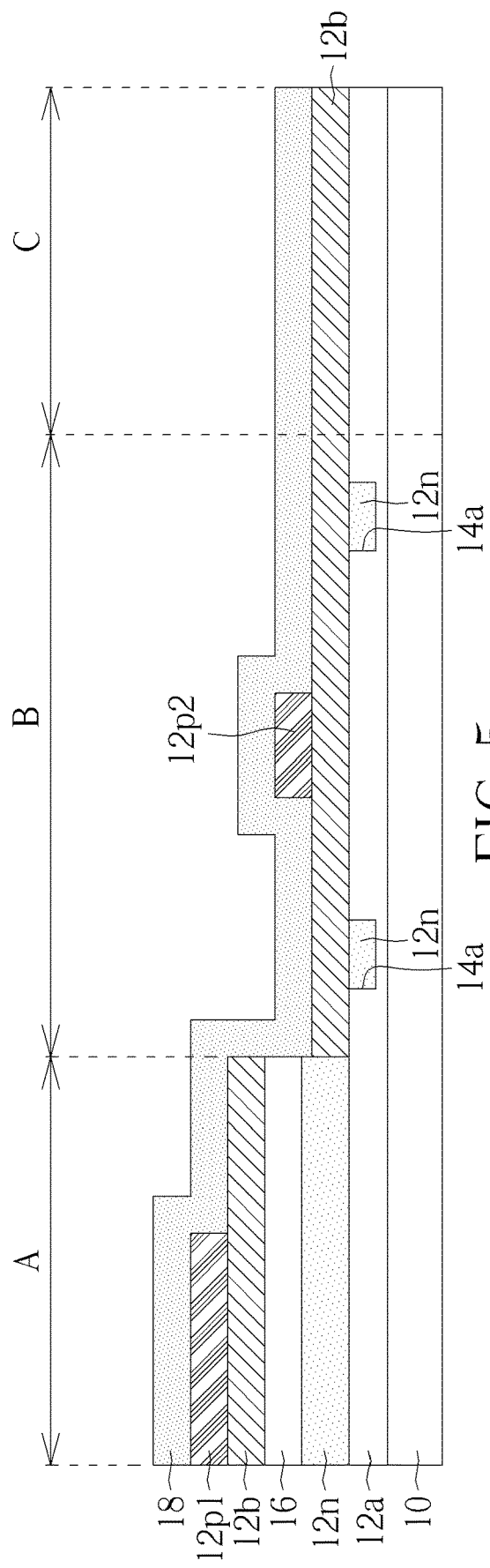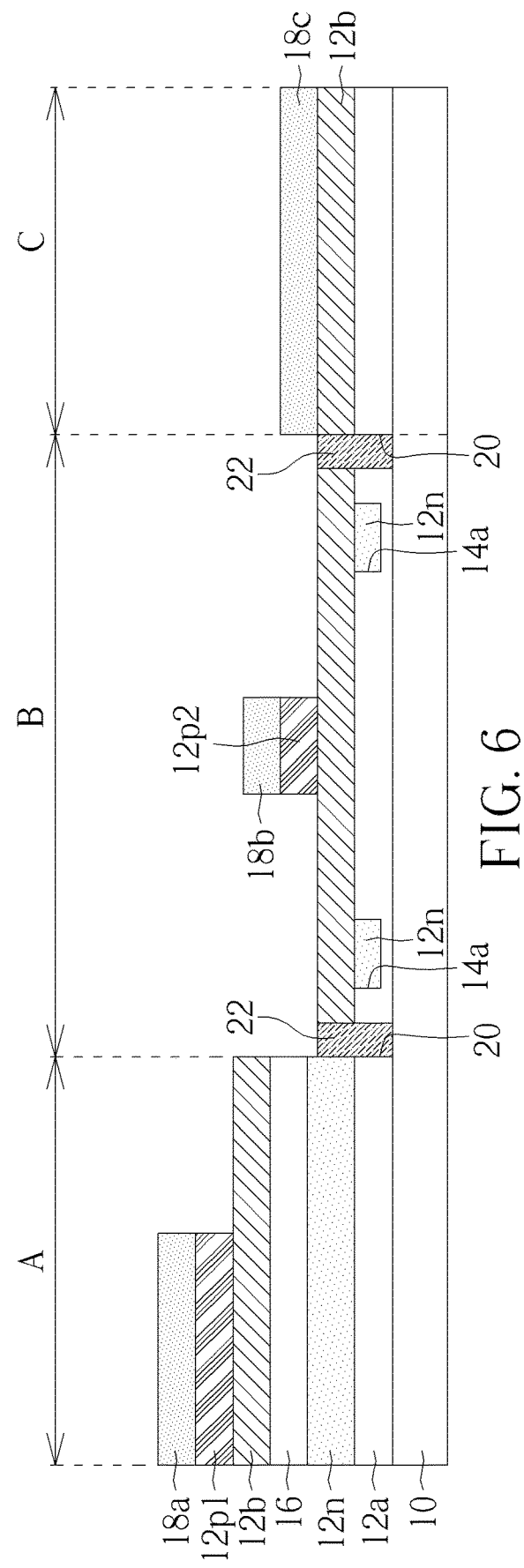

STRUCTURE WITH PHOTODIODE, HIGH ELECTRON MOBILITY TRANSISTOR, SURFACE ACOUSTIC WAVE DEVICE AND FABRICATING METHOD OF THE SAME

BACKGROUND OF THE INVENTION

1. Field of the Invention

The present invention relates to an integrated fabricating method of a structure with a photodiode, a high electron mobility transistor (HEMT) and a surface acoustic wave (SAW) device.

2. Description of the Prior Art

Photodiodes are light detectors that can convert light into current or voltage signals. They can output corresponding analog electrical signals or be used in controlling switches and processing digital signals based on the degree of light received. An HEMT is a kind of field effect transistor, which uses two materials with different energy gaps to form a heterojunction to provide a channel for carriers. Compared with traditional transistors, the HEMT has higher electron speed and electron density, so it can be used to increase speed of switch on or off. A surface acoustic wave filter (SAW Filter) can be widely used in various wireless communication systems, TV sets, VCRs and GPS receivers. Its main function is to filter out noise. The SAW Filter is easier to install than traditional filters.

However, with the shrinking demand for semiconductor chips, integration of circuits can increase component integration and reduce process steps. In addition, because the size of the chip becomes smaller, the distance of electron movement is reduced, so the speed of the chip can also be increased.

SUMMARY OF THE INVENTION

In view of this, the present invention provides an integrated process and structure having a photodiode, an HEMT and an SAW device to decrease fabricating cost and integrate devices on a chip.

According to a preferred embodiment of the present invention, a photodiode, an HEMT and an SAW device includes a photodiode including a first III-V semiconductor layer, a first N-type III-V semiconductor layer, a multi-quantum well (MQW) layer, a second III-V semiconductor layer, a P-type III-V semiconductor layer and a first electrode disposed from bottom to top. A second electrode is disposed on and contacts the first N-type III-V semiconductor layer. An HEMT includes a channel layer. An active layer is disposed on the channel layer. A P-type gate is disposed on the active layer. A gate electrode is disposed on and contacts the P-type gate. Two source/drain electrodes are respectively disposed at two sides of the P-type gate, wherein the two source/drain electrodes are embedded within the active layer and the channel layer. Schottky contact is between the first electrode and the P-type III-V semiconductor layer, and between the gate electrode and the P-type gate, Ohmic contact is between the second electrode and the first N-type III-V semiconductor layer, between one of the two source/drain electrodes and the active layer and between the other one of two source/drain electrodes and the active layer.

According to another preferred embodiment of the present invention, a fabricating method of a structure with a photodiode, an HEMT and an SAW device includes providing a substrate which is divided into a photodiode region and a transistor region. Later, a first III-V semiconductor layer is formed to cover the substrate. Next, two first recesses is formed to be embedded into the first III-V semiconductor layer within the transistor region. Subsequently, an N-type III-V semiconductor layer and an MQW layer are formed to cover the first III-V semiconductor layer from bottom to top, wherein the N-type III-V semiconductor layer fills up the two first recesses. After that, the N-type III-V semiconductor layer on a top surface of the first III-V semiconductor layer and the MQW layer on the top surface of the first III-V semiconductor layer are removed. After removing the N-type III-V semiconductor layer and the MQW layer on the top surface of the first III-V semiconductor layer, a second III-V semiconductor layer and a P-type III-V semiconductor material layer are formed from bottom to top to stack within the photodiode region and the transistor region. Next, part of the P-type III-V semiconductor material layer is removed, wherein the P-type III-V semiconductor material layer remaining within the photodiode region becomes a P-type semiconductor layer, and the P-type III-V semiconductor material layer remaining within the transistor region becomes a P-type gate. Later, two first conductive layers are respectively formed to cover the P-type III-V semiconductor material layer and the P-type gate. Then, two second recesses are respectively formed in each of the first recesses. Finally, three second conductive layers are formed, wherein two of the three second conductive layers respectively fill in the two second recesses, one of the three second conductive layers contacts the N-type III-V semiconductor layer within the photodiode region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 depict a fabricating method of a structure with a photodiode, an HEMT and an SAW device according to a preferred embodiment of the present invention, wherein:

FIG. 1 depicts a substrate divided into a photodiode region, a transistor region and an SAW region;
FIG. 2 depicts a fabricating stage following FIG. 1;
FIG. 3 depicts a fabricating stage following FIG. 2;
FIG. 4 depicts a fabricating stage following FIG. 3;
FIG. 5 depicts a fabricating stage following FIG. 4;
FIG. 6 depicts a fabricating stage following FIG. 5;
FIG. 7 depicts a fabricating stage following FIG. 6;
FIG. 8 depicts a fabricating stage following FIG. 7;
FIG. 9 depicts a fabricating stage following FIG. 8; and
FIG. 10 depicts a fabricating stage following FIG. 9.

DETAILED DESCRIPTION

FIG. 1 to FIG. 10 depict a fabricating method of a structure with a photodiode, a high electron mobility transistor (HEMT) and a surface acoustic wave (SAW) device according to a preferred embodiment of the present invention.

Figure 1:
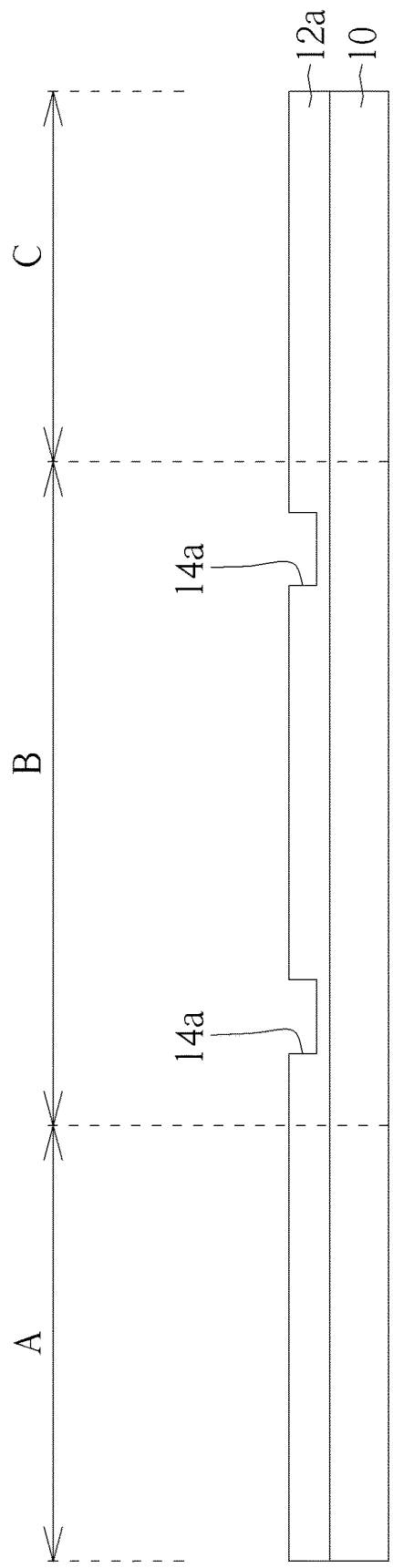
Figure 2:
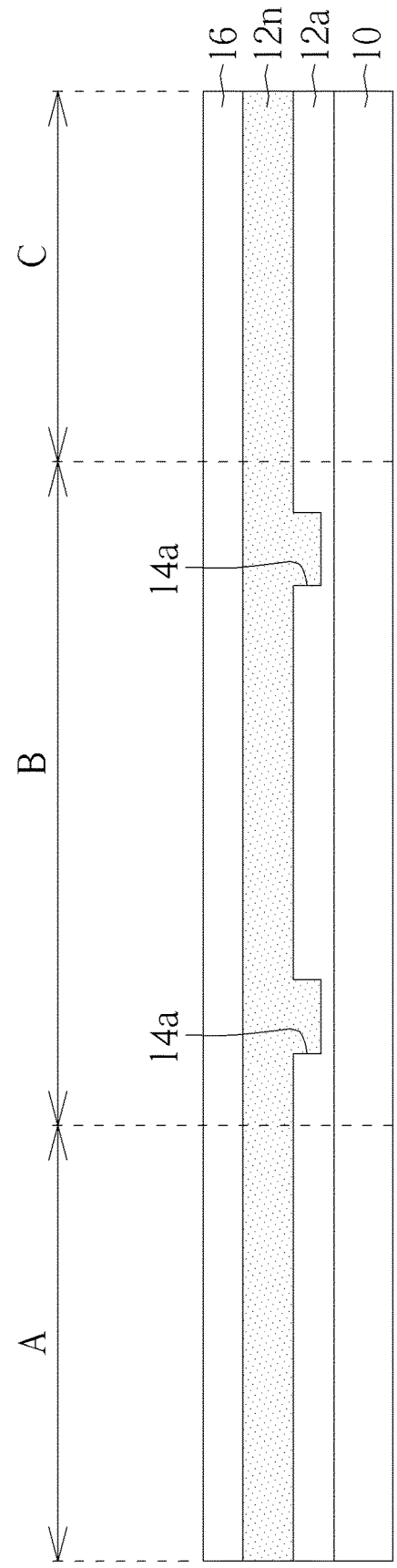

As shown in FIG. 1, a substrate 10 is provided. The substrate 10 can be a silicon substrate, a germanium substrate, a gallium arsenide substrate, a silicon germanium substrate, an indium phosphide substrate, a gallium nitride substrate, a silicon carbide substrate or a silicon-on-insulator. The substrate 10 is divided into a photodiode region A, a transistor region B and an SAW region C. Next, a first III-V semiconductor layer 12a is formed to cover the photodiode region A, the transistor region B and the SAW region C on the substrate 10. Later, two first recesses 14a are formed to embed into the first III-V semiconductor layer 12a within the transistor region B. The bottom of each of the first recesses 14a doesn't penetrate the first III-V semiconductor layer 12a. As shown in FIG. 2, an N-type III-V semiconductor layer 12n and a multi-quantum well (MQW) layer 16 are formed to cover the first III-V semiconductor layer 12a from bottom to top. The N-type III-V semiconductor layer 12n fills up the first recesses 14a. The MQW layer 16 preferably includes a stack layer made of gallium nitride and indium gallium nitride. The top surface of the N-type III-V semiconductor layer 12n and the top surface of the MQW layer 16 are parallel to the top surface of the substrate 10.

Figure 3:
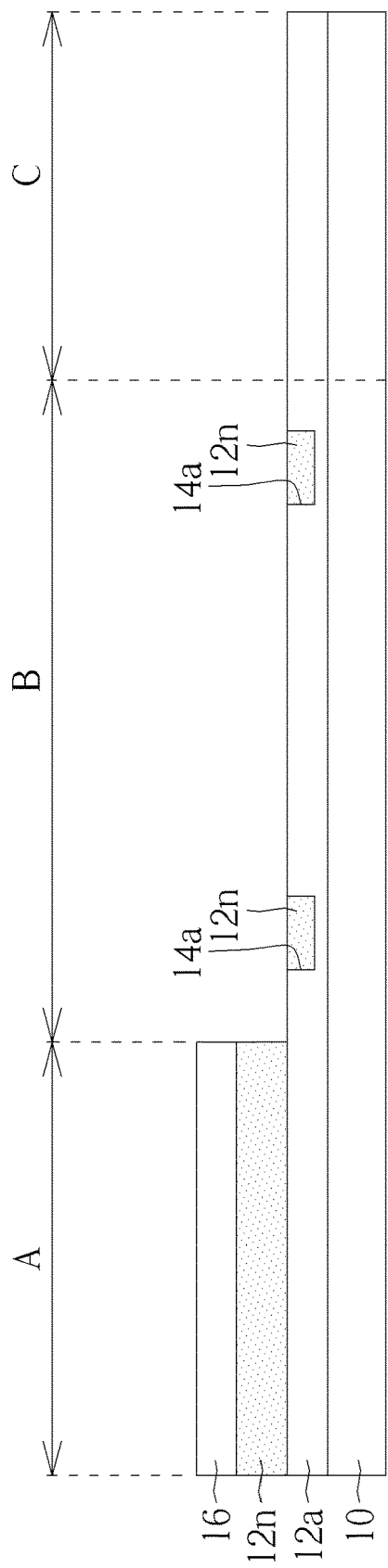
Figure 4:
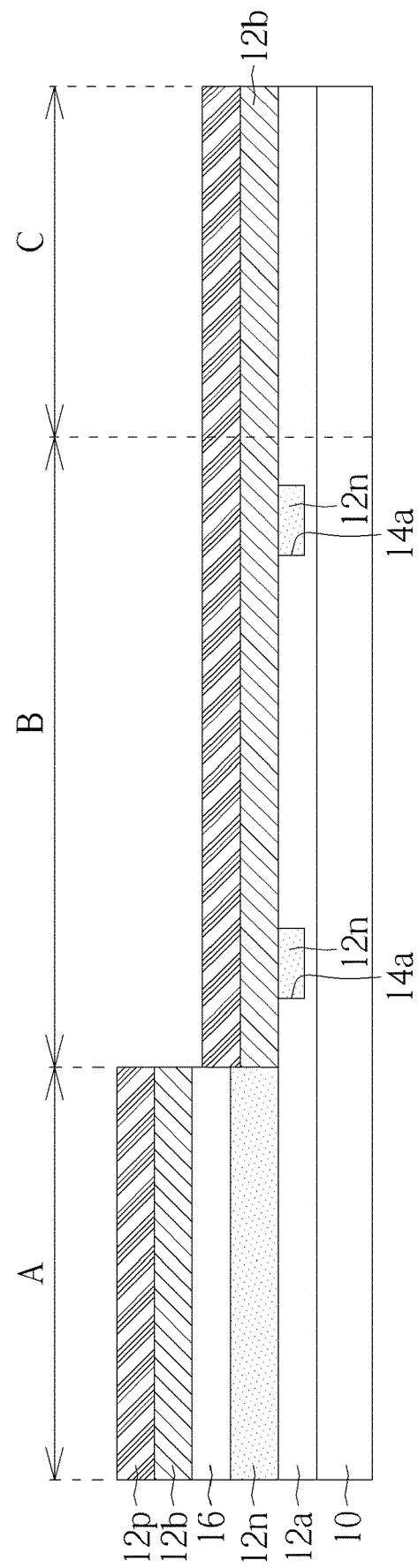

As show in FIG. 3, both of the N-type III-V semiconductor layer 12n and the MQW layer 16 on the top surface of the first III-V semiconductor layer 12a within the transistor region B and the SAW region C are removed. That is, only the N-type III-V semiconductor layer 12n and the MQW layer 16 within the photodiode region A and the N-type III-V semiconductor layer 12n within the first recesses 14a remain. As shown in FIG. 4, a second III-V semiconductor layer 12b and a P-type III-V semiconductor material layer 12p are formed from bottom to top to stack within the photodiode region A, the transistor region B and the SAW region C. In details, the second III-V semiconductor layer 12b within the photodiode region A contacts the MQW layer 16. The second III-V semiconductor layer 12b within the transistor region B contacts the first III-V semiconductor layer 12a and the N-type III-V semiconductor layer 12n within the first recesses 14a. The second III-V semiconductor layer 12b within the SAW region C contacts the first III-V semiconductor layer 12a. Moreover, the first III-V semiconductor layer 12a, the N-type III-V semiconductor layer 12n, the MQW layer 16, the second III-V semiconductor layer 12b and the P-type III-V semiconductor material layer 12p are preferably formed by epitaxial processes.

As shown in FIG. 5, the P-type III-V semiconductor material layer 12p is patterned to remove part of the P-type III-V semiconductor material layer 12p. In this way, the P-type III-V semiconductor material layer 12p remaining within the photodiode region A becomes a P-type semiconductor layer 12p1, and the P-type III-V semiconductor material layer 12p remaining within the transistor region B becomes a P-type gate 12p2. The P-type III-V semiconductor material layer 12p within the SAW region C is entirely removed. The P-type semiconductor layer 12p1 only covers part of the second III-V semiconductor layer 12b within the photodiode region A. The P-type gate 12p2 is between the two first recesses 14a. Next, a first conductive material layer 18 is formed to conformally cover the P-type semiconductor layer 12p1, the P-type gate 12p2 and the second III-V semiconductor layer 12b. The first conductive material layer 18 is preferably formed by a deposition process. The first conductive material layer 18 is preferably Schottky metal and the Schottky metal includes a stacked layer formed by TiN/Al/TiN, Ni/Au, W/Au or Ni/Ag.

As shown in FIG. 6, the first conductive material layer 18 is patterned to separate the first conductive material layer 18 into three first conductive layers 18a/18b/18c. The first conductive material layer 18 can be patterned by an etching process. Later, the first III-V semiconductor layer 12a and the second III-V semiconductor layer 12b are etched to form two recesses 20 near an edge of the transistor region B. Then, an insulating layer 22 fills into the recesses 20 to isolate the transistor region B from other regions. The first III-V semiconductor layer 12a within the transistor region B will serve as a channel layer for an HEMT afterwards. The second III-V semiconductor layer 12b within the transistor region B will serve as an active layer for the HEMT afterwards. Moreover, three first conductive layer 18a/18b/18c respectively cover and contact the P-type III-V semiconductor layer 12p1, the P-type gate 12p2 and the second III-V semiconductor layer 12b within the SAW region C. The first conductive layer 18a contacting the P-type III-V semiconductor layer 12p1 within the photodiode region A will serve as a first electrode for a photodiode. The first conductive layer 18b contacting the P-type gate 12p2 within the transistor region B will serve as a gate electrode for the HEMT. The first conductive layer 18c contacting the second III-V semiconductor layer 12b within the SAW region C will serve as an electrode for an SAW device.

Figure 7:
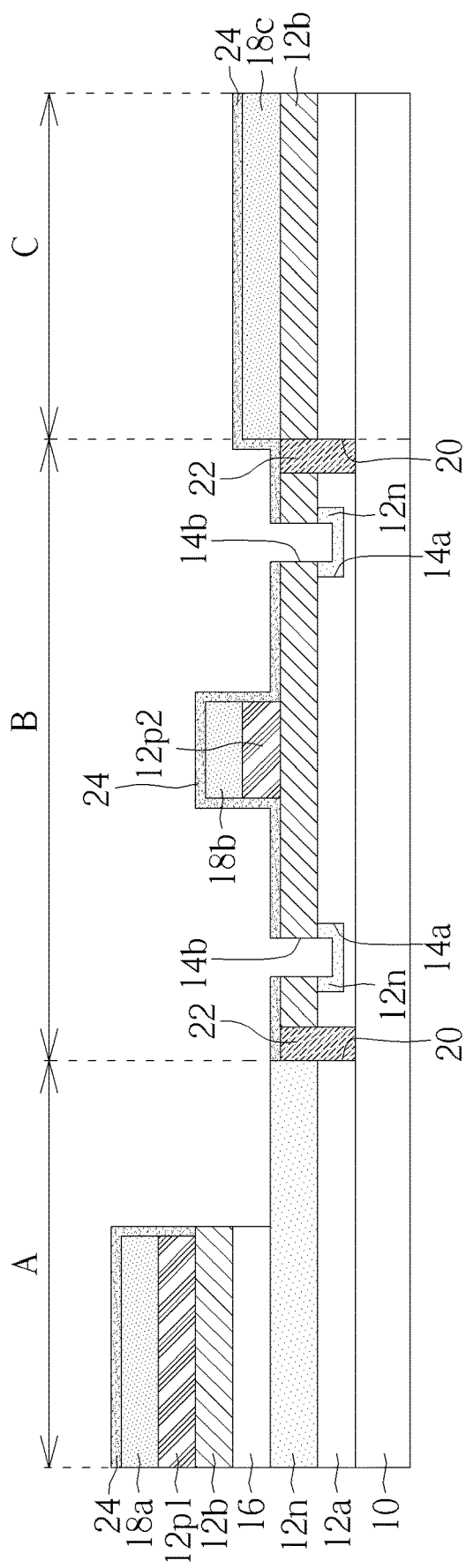

As shown in FIG. 7, a protective layer 24 is formed to conformally cover the three first conductive layers 18a/18b/18c, the N-type III-V semiconductor layer 12n and the second III-V semiconductor layer 12b. Next, the protective layer 24, the second III-V semiconductor layer 12b and the MQW layer 16 within the photodiode region A are etched and the second III-V semiconductor layer 12b and the first III-V semiconductor layer 12a within the transistor region B are etched. In this way, the second III-V semiconductor layer 12b and the MQW layer 16 not covered by the first conductive layer 18a within the photodiode region A are removed and two second recesses 14b are respectively formed within the first recesses 14a. The second recesses 14b extend into the second III-V semiconductor layer 12b and the protective layer 24. The first conductive layer 18c and the protective layer 24 within the SAW region C are not etched. Now, part of the N-type III-V semiconductor layer 12n within the photodiode region A is exposed, and the N-type III-V semiconductor layer 12n remains around the bottom of the second recesses 14b.

Figure 8:
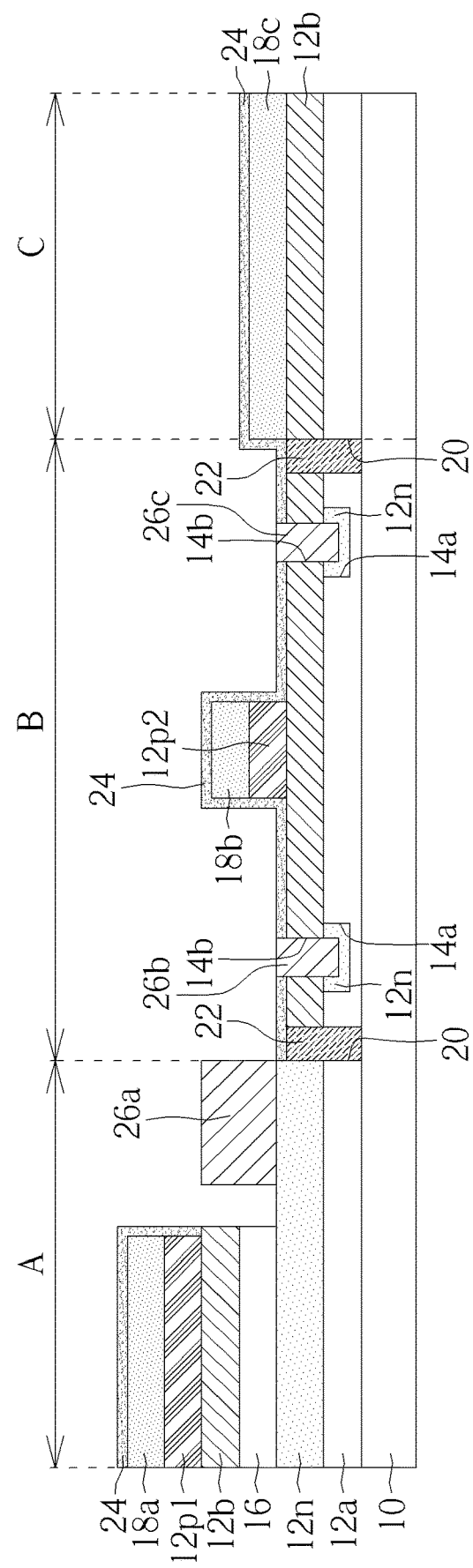

As shown in FIG. 8, three second conductive layers 26a/26b/26c are formed. Two of the second conductive layers 26b/26c respectively fill in the two second recesses 14b, one of the second conductive layers 26a contacts the N-type III-V semiconductor layer 12n within the photodiode region A. The second conductive layers 26a/26b/26c are ohmic metal, and the ohmic metal includes a stacked layer of Ti/Al/TiN, Si/Ti/Al/TiN, Si/Ti/Ta/Al/TiN or Si/Ti/Al/Ti/Au. The second conductive layers 26b/26c within the second recesses 14b will serve as source/drain electrodes of the HEMT. The second conductive layer 26a within the photodiode region A will serve as a second electrode for the photodiode.

Figure 9:
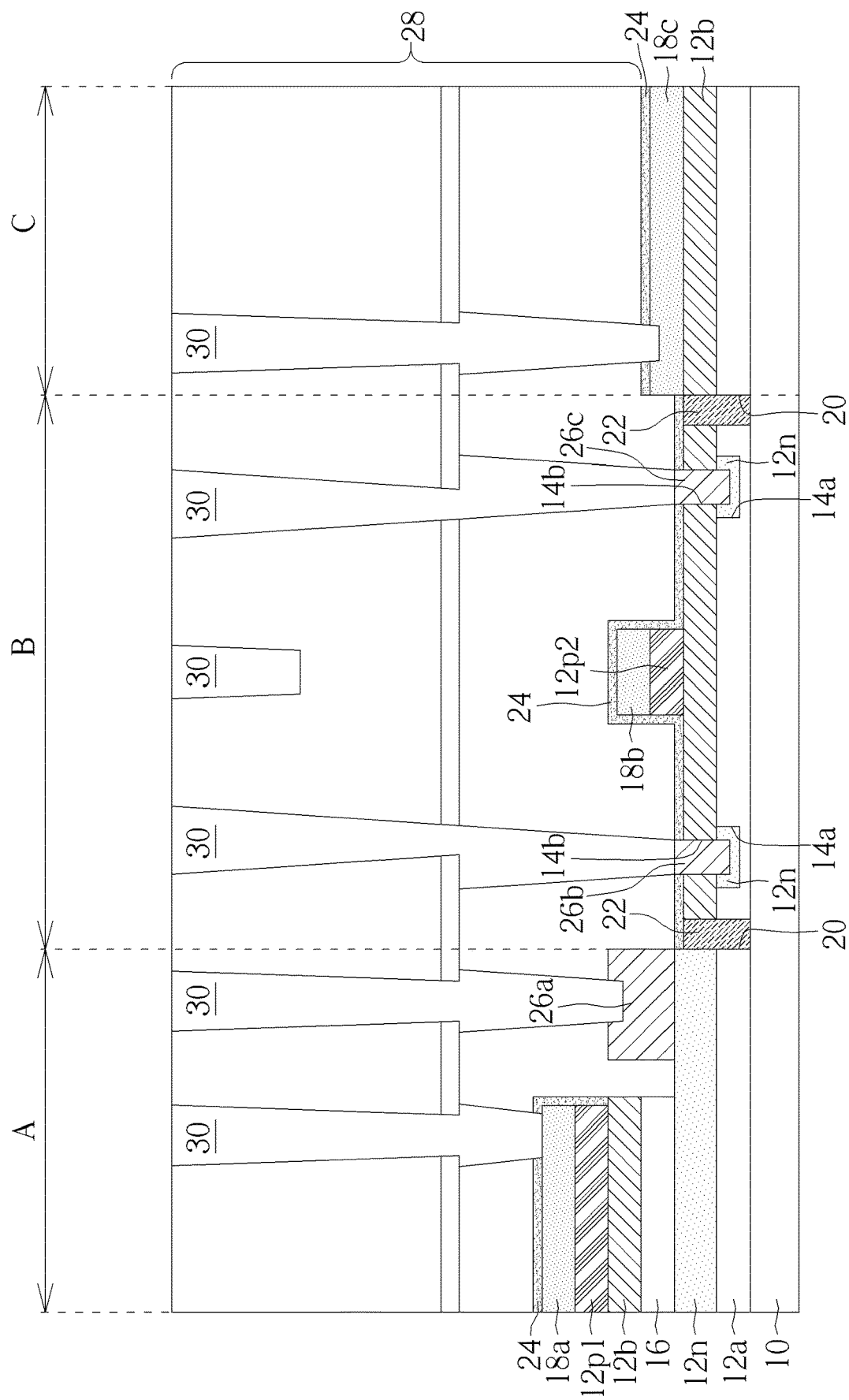
Figure 10:
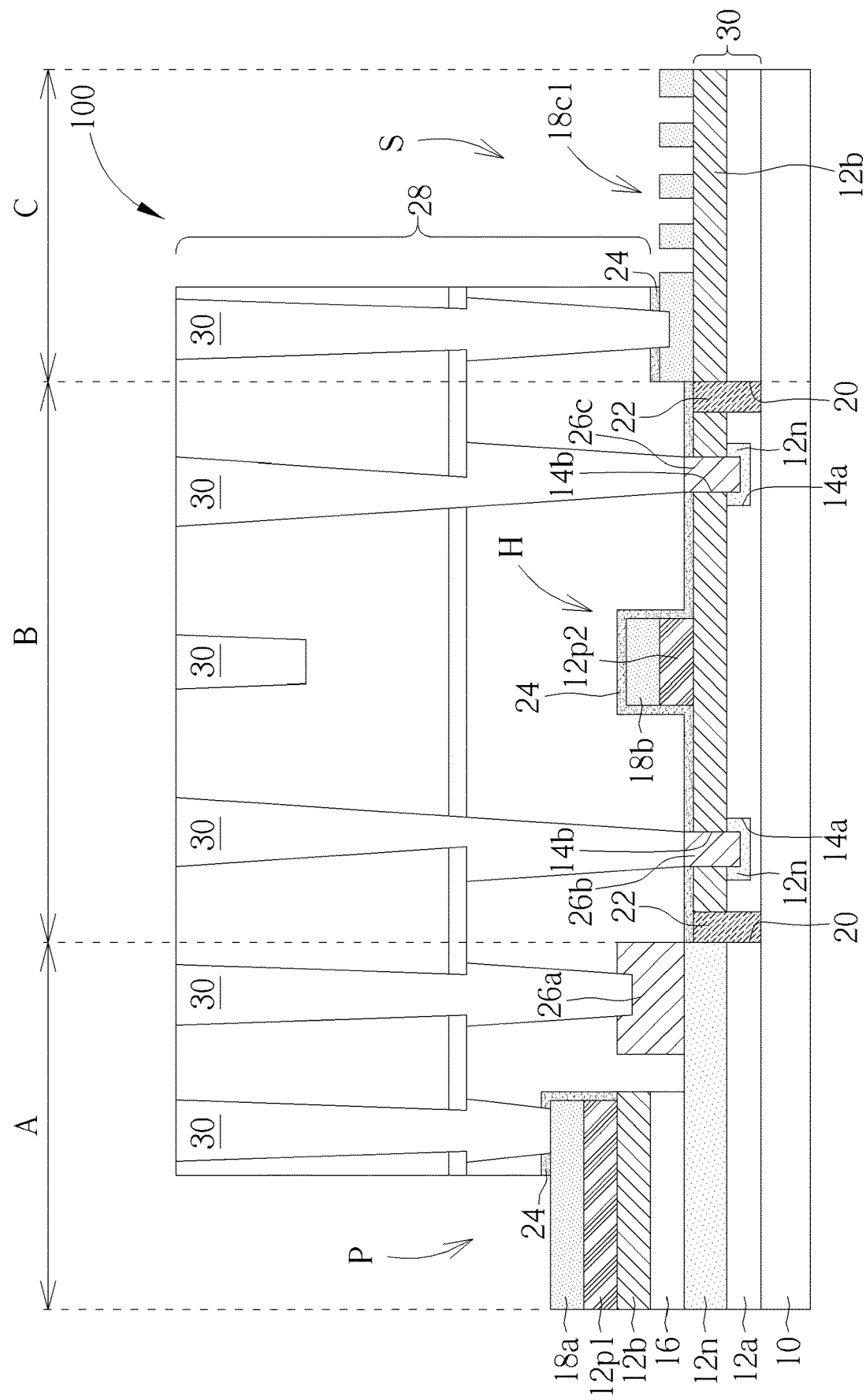

As shown in FIG. 9, a dielectric layer 28 is formed to cover the photodiode region A, the transistor region B and the SAW region C entirely. Next, numerous contact plugs 30 are formed to penetrate the dielectric layer 28. The contact plugs 30 respectively contact the first conductive layer 18a and the second conductive layer 26a within the photodiode region A, and contact the second conductive layers 26b/26c within the transistor region B and the first conductive layer 18c within the SAW region C. As shown in FIG. 10, part of the dielectric layer 28 and part of the protective layer 24 within the photodiode region A and the SAW region C are removed to expose part of the first conductive layer 18a within the photodiode region A and expose part of the first conductive layer 18c within the SAW region C. Next, the first conductive layer 18c within the SAW region C is etched to form an interdigital transducer 18c1. Now, a structure 100 with a photodiode, an HEMT and an SAW device of the present invention is completed.

As shown in FIG. 10, the structure 100 with a photodiode, an HEMT and an SAW device includes a photodiode P, an HEMT H and an SAW device S. The photodiode P includes a first III-V semiconductor layer 12a, a first N-type III-V semiconductor layer 12n, a MQW layer 16, a second III-V semiconductor layer 12b, a P-type III-V semiconductor layer 12p1 and a first electrode (first conductive layer 18a) disposed from bottom to top. A second electrode (second conductive layer 26a) is disposed on and contacts the first N-type III-V semiconductor layer 12n. The HEMT H includes a channel layer (first III-V semiconductor layer 12a) and an active layer (second III-V semiconductor layer 12b) disposed on the channel layer. A P-type gate 12p2 is disposed on the active layer. A gate electrode (first conductive layer 18b) is disposed on and contacts the P-type gate 12p2. Two source/drain electrodes (second conductive layers 26b/26c) are respectively disposed at two sides of the P-type gate 12p2. The two source/drain electrodes are embedded within the active layer and the channel layer. The two N-type III-V semiconductor layers 12n are embedded within the channel layer. Each of the N-type III-V semiconductor layers 12n respectively contacts one of the source/drain electrodes (second conductive layers 26b/26c).

The SAW device S includes a piezoelectric layer 30. The piezoelectric layer 30 is formed by the first III-V semiconductor layer 12a and the second III-V semiconductor layer 12b. An interdigital transducer 18c1 is disposed on and contacts the piezoelectric layer 30. It is noteworthy that Schottky contact is between the first electrode (first conductive layer 18a) and the P-type III-V semiconductor layer 12p1, between the gate electrode (first conductive layer 18b) and the P-type gate 12p2, and between the interdigital transducer 18c1 and the piezoelectric layer 30. Ohmic contact is between the second electrode (second conductive layer 26a) and the N-type III-V semiconductor layer 12n, between the source/drain electrode (second conductive layers 26b) and the active layer (second III-V semiconductor layer 12b) and between the source/drain electrode (second conductive layers 26c) and the active layer.

Moreover, the N-type III-V semiconductor layer 12n of the photodiode P and N-type III-V semiconductor layer 12n of the HEMT H are originally formed by the same material layer. Therefore, the N-type III-V semiconductor layer 12n of the photodiode P and N-type III-V semiconductor layer 12n of the HEMT H are of the same material. According to a prefer embodiment of the present invention, the N-type III-V semiconductor layer 12n is N-type gallium nitride. Furthermore, the P-type III-V semiconductor layer 12p1 and the P-type gate 12p2 are made of the P-type III-V semiconductor material layer 12p, therefore, the P-type III-V semiconductor layer 12p1 and the P-type gate 12p2 are of the same material. According to a prefer embodiment of the present invention, the P-type III-V semiconductor layer 12p1 and the P-type gate 12p2 are P-type gallium nitride. The source/drain electrodes (second conductive layers 26b/26c) and the second electrode (second conductive layers 26a) are all second conductive layers, therefore they have the same material. According to a prefer embodiment of the present invention, the source/drain electrodes and the second electrode are made of ohmic metal, and the ohmic metal includes a stacked layer of Ti/Al/TiN, Si/Ti/Al/TiN, Si/Ti/Ta/Al/TiN or Si/Ti/Al/Ti/Au. The first electrode (first conductive layer 18a), the gate electrode (first conductive layer 18b), the interdigital transducer 18c1 are all made of the first conductive material layer 18. Therefore, the first electrode, the gate electrode and the interdigital transducer 18c1 are all made of the same material. According to a prefer embodiment of the present invention, the first electrode, the gate electrode, the interdigital transducer 18c1 are made of Schottky metal and the Schottky metal includes a stacked layer of TiN/Al/TiN, Ni/Au, W/Au or Ni/Ag.

Moreover, the first III-V semiconductor layer 12a is gallium nitride. The second III-V semiconductor layer 12b is aluminum gallium nitride. The MQW layer 16 preferably includes a stacked layer made of gallium nitride and indium gallium nitride.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A structure with a photodiode, a high electron mobility transistor (HEMT) and a surface acoustic wave (SAW) device, comprising: a photodiode, comprising:
   a first III-V semiconductor layer;
   a first N-type III-V semiconductor layer disposed on and contacting the first III-V semiconductor layer;
   a multi-quantum well (MQW) layer disposed on and contacting the first N-type III-V semiconductor layer;
   a second III-V semiconductor layer disposed on and contacting the MQW layer;
   a P-type III-V semiconductor layer disposed on and contacting the second III-V semiconductor layer;
   a first electrode disposed on and contacting the P-type III-V semiconductor layer; and
   a second electrode disposed on and contacting the first N-type III-V semiconductor layer;
an HEMT comprising:
   a channel layer;
   an active layer disposed on the channel layer;
   a P-type gate disposed on the active layer;
   a gate electrode disposed on and contacting the P-type gate; and
   two source/drain electrodes respectively disposed at two sides of the P-type gate, wherein the two source/drain electrodes are embedded within the active layer and the channel layer;
wherein Schottky contact is between the first electrode and the P-type III-V semiconductor layer, and between the gate electrode and the P-type gate, Ohmic contact is between the second electrode and the first N-type III-V semiconductor layer, between one of the two source/drain electrodes and the active layer and between the other one of two source/drain electrodes and the active layer.

2. The structure with a photodiode, an HEMT and an SAW device of claim 1, further comprising:
   an SAW device, wherein the SAW device comprises:
   a piezoelectric layer;
   an interdigital transducer disposed on and contacting the piezoelectric layer;
   wherein Schottky contact is between the interdigital transducer and the piezoelectric layer.

3. The structure with a photodiode, an HEMT and an SAW device of claim 1, further comprising two second N-type III-V semiconductor layers embedded within the channel layer, and each of the two second N-type III-V semiconductor layers respectively contacting one of the two source/drain electrodes.

4. The structure with a photodiode, an HEMT and an SAW device of claim 3, wherein the first III-V semiconductor layer and the two second N-type III-V semiconductor layers are made of the same material.

5. The structure with a photodiode, an HEMT and an SAW device of claim 4, wherein the first III-V semiconductor layer and the two second N-type III-V semiconductor layers are made of N-type gallium nitride.

6. The structure with a photodiode, an HEMT and an SAW device of claim 1, wherein the P-type III-V semiconductor layer and the P-type gate are made of the same material.

7. The structure with a photodiode, an HEMT and an SAW device of claim 6, wherein the P-type III-V semiconductor layer and the P-type gate are made of P-type gallium nitride.

8. The structure with a photodiode, an HEMT and an SAW device of claim 1, wherein the two source/drain electrodes and the second electrode are made of the same material.

9. The structure with a photodiode, an HEMT and an SAW device of claim 8, wherein the two source/drain electrodes and the second electrode are made of ohmic metal, and the ohmic metal comprises Ti/Al/TiN, Si/Ti/Al/TiN, Si/Ti/Ta/Al/TiN or Si/Ti/Al/Ti/Au.

10. The structure with a photodiode, an HEMT and an SAW device of claim 2, wherein the first electrode, the gate electrode and the interdigital transducer are made of the same material.

11. The structure with a photodiode, an HEMT and an SAW device of claim 2, wherein the first electrode, the gate electrode and the interdigital transducer are made of Schottky metal and the Schottky metal comprises TlN/Al/TlN, Ni/Au, W/Au or Ni/Ag.

* * * * *